United States Patent [19]

Iida

[11] Patent Number: 4,906,871

[45] Date of Patent: Mar. 6, 1990

[54] LEVEL SHIFT CIRCUIT FOR CONVERTING A SIGNAL IN AN ECL LEVEL INTO A SIGNAL IN A CMOS LOGIC LEVEL

[75] Inventor: Tetsuya Iida, Yokohama, Japan

[73] Assignee: Kabushiki Kaisha Toshiba, Kawasaki, Japan

[21] Appl. No.: 275,867

[22] Filed: Nov. 25, 1988

[30] Foreign Application Priority Data

Nov. 26, 1987 [JP] Japan ................. 62-297961

[51] Int. Cl.⁴ ............... H03K 19/092; H03K 19/003; H03K 19/086; H03K 17/10
[52] U.S. Cl. .................................. 307/475; 307/446; 307/570; 307/443; 307/448; 307/542; 307/547; 307/548
[58] Field of Search ............... 307/475, 448, 446, 455, 307/443, 542, 544, 546, 547, 548, 573, 574, 575, 576, 579, 585, 264, 570, 451, 473, 362, 368

[56] References Cited

U.S. PATENT DOCUMENTS

| | | | |
|---|---|---|---|
| 4,029,971 | 6/1977 | Pryor | 307/473 |
| 4,316,105 | 2/1982 | Fowler | 307/362 |
| 4,518,880 | 5/1985 | Masuda et al. | 307/577 |
| 4,697,109 | 9/1987 | Honma et al. | 307/475 |
| 4,703,198 | 10/1987 | Porter et al. | 307/475 X |
| 4,754,165 | 6/1988 | Cornish | 307/448 X |
| 4,797,583 | 1/1989 | Ueno et al. | 307/475 |

OTHER PUBLICATIONS

Oqiue et al., "13-ns, 500-mW, 64-kbit ECL RAM Using, HI-BICMOS Technology," IEEE Journal of Solid-State Circuits, vol. SC-21, No. 5, Oct. 1986, pp. 681-685.

*Primary Examiner*—Stanley D. Miller
*Assistant Examiner*—David R. Bertelson
*Attorney, Agent, or Firm*—Finnegan, Henderson, Farabow, Garrett and Dunner

[57] ABSTRACT

A level shift circuit is made up of a capacitor, a MOS inverter, and a bias circuit for applying a bias voltage to an input node of the MOS inverter. A first electrode of the capacitor is connected to an output stage of an ECL circuit, while a second electrode to the input node of the MOS inverter. The output node of the MOS inverter is coupled with an input stage of a CMOS circuit. An output signal of the ECL circuit is capacitively coupled with the input node of the MOS inverter so that it is superposed onto a bias voltage being supplied from the bias circuit. A level of this signal is shifted to a CMOS logic level by the MOS inverter, and then applied to the input stage of the CMOS circuit.

17 Claims, 5 Drawing Sheets

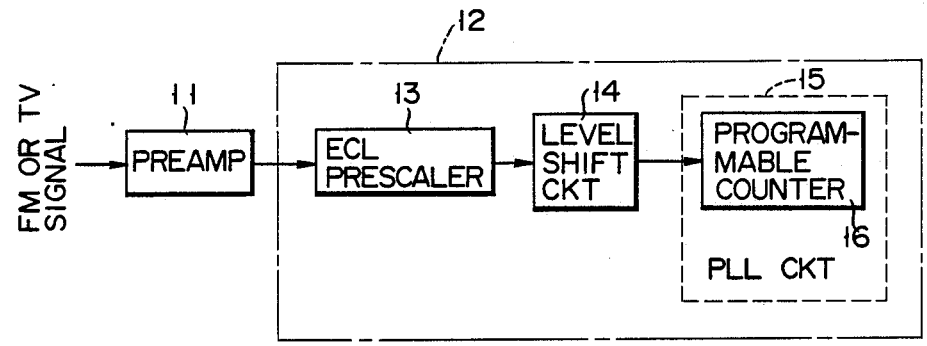
F I G. 2

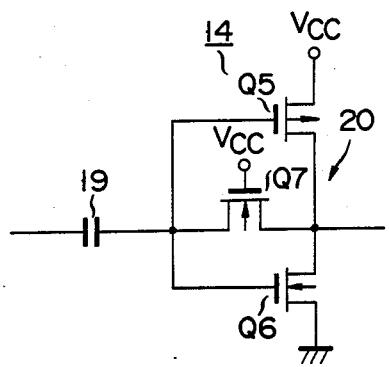
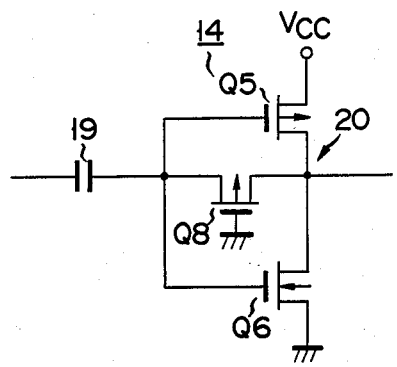
F I G. 5    F I G. 6
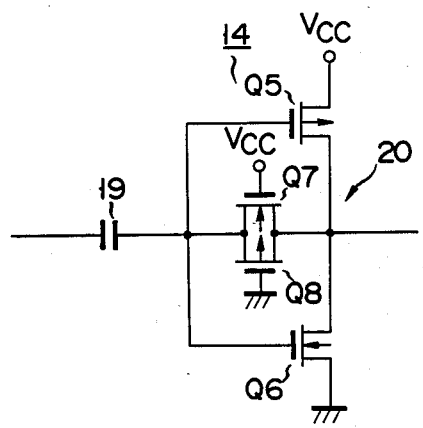
F I G. 7

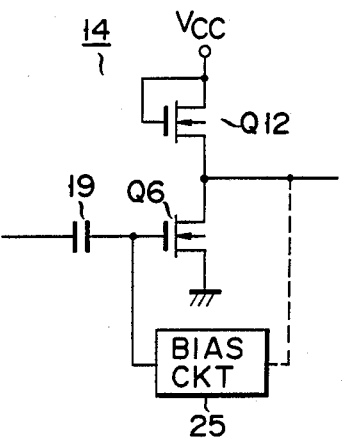
F I G. 11
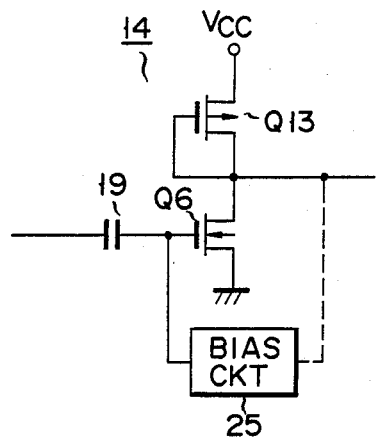
F I G. 12
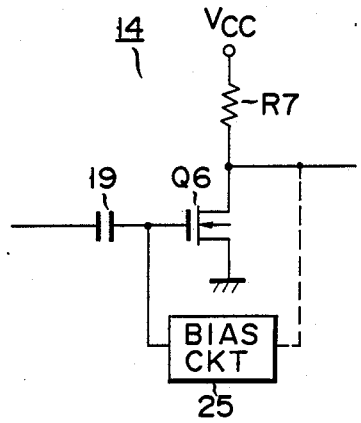
F I G. 13

LEVEL SHIFT CIRCUIT FOR CONVERTING A SIGNAL IN AN ECL LEVEL INTO A SIGNAL IN A CMOS LOGIC LEVEL

BACKGROUND OF THE INVENTION

1. Field of the Invention

The present invention relates to a level shift circuit, which is used for an FM frequency band prescaler in a radio receiver of the digital tuning type, for example, and shifts an output level of an ECL (Emitter Coupled Logic) into an input level of a CMOS (Complementary Metal Oxide Semiconductor) circuit.

2. Description of the Related Art

There has been known an ECL-CMOS level shift circuit of this type as shown in FIG. 1. The level shift circuit is described in "IEEE JOURNAL OF SOLID-STATE CIRCUITS, VOL. SC-21, NO. 5, OCT. 1986, 13-ns, 500-mW, 64Kbit, ECL RAM Using HI-BICMOS Technology" KATSUMI OGIUE et al., FIG. 6.

To secure a normal operation of the circuit shown in FIG. 1, all of the MOS transistors Q1 to Q4 making up a level shifter must operate in a saturation region. In an actual integrated circuit, however, those transistors Q1 to Q4 sometimes operate outside the saturation region due to a variance of circuit element parameters caused in the manufacturing stage, and a variation in the power voltage, and the like. When those transistors operate outside the saturation region, the level shift circuit operation is instable, and a production yield of the IC containing the level shift circuit is degraded. In designing the level shift circuit which is stable against the parameter variance and the power voltage variation, it is a key point how a voltage range of the gate bias voltage to amplifier (input) MOS transistors Q1 and Q2 is set. The gate bias voltage range is determined depending on resistance of resistors R1 and R2 of the ECL receiver and current IA of constant current source 10. The resistance and current IA also are inevitably influenced by the parameter variance and the power voltage variation. Thus, the character varying factors exist not only in the level shifter but also in the ECL receiver. This fact makes the design of the ECL receiver intricate and difficult.

SUMMARY OF THE INVENTION

Accordingly, an object of the present invention is to provide a level shift circuit which stably operates against the parameter variance and the power voltage variation, with a high production yield.

Another object of the present invention is to provide a level shift circuit which allows an easy design of the output stage of an ECL circuit.

A further object of the present invention is to provide a level shift circuit which requires a reduced number of circuit elements, and a small power dissipation.

According to one aspect of the present invention, there is provided a level shift circuit comprising a capacitor coupled at one electrode with an output stage of an ECL circuit, a MOS inverter connected at an input node to the other electrode of the capacitor and at an output node to an input stage of a CMOS circuit, and a bias circuit for applying a bias voltage to the input node of the MOS inverter.

With such an arrangement, the ECL circuit is capacitively coupled with the CMOS circuit. Since the capacitor blocks flow of a voltage variation like DC, it blocks transfer of the DC like voltage variation due to the parameter variance and the power voltage variation. Further, since a bias voltage is applied to the input node of the MOS inverter, the output signal of the ECL circuit is superposed on the bias voltage and transferred to the input node of the MOS inverter. The bias voltage is set at a value near a circuit threshold voltage of the MOS inverter. Therefore, if the threshold voltage of the transistors making up the MOS inverter and the power voltage vary within a small range, the level shift circuit is stably operable.

For the above reasons, the present invention provides a level shift circuit which stably operates against the parameter variance and the power voltage variation, with a high production yield. In designing the circuit, there is no need for allowing for the parameter variance and the power voltage variation. Accordingly, design of the output stage of the ECL circuit is easy. Since the capacitor and the MOS inverter make up the level shift circuit, the required number of circuit elements is smaller than that of the level shift circuit shown in FIG. 1, with a subsequent decrease of the power dissipation in the circuit.

BRIEF DESCRIPTION OF THE DRAWINGS

FIG. 2 is a block diagram showing a circuit to which a level shift circuit according to the present invention is applied;

FIGS. 5 through 8 are circuit diagrams showing bias circuits each for applying a bias voltage to the input node of a MOS inverter in the circuit of FIG. 3; and FIGS. 9 through 13 are circuit diagrams of other modifications of the MOS inverter in the circuit of FIG. 3.

DETAILED DESCRIPTION OF THE PREFERRED EMBODIMENTS

Figure 1:
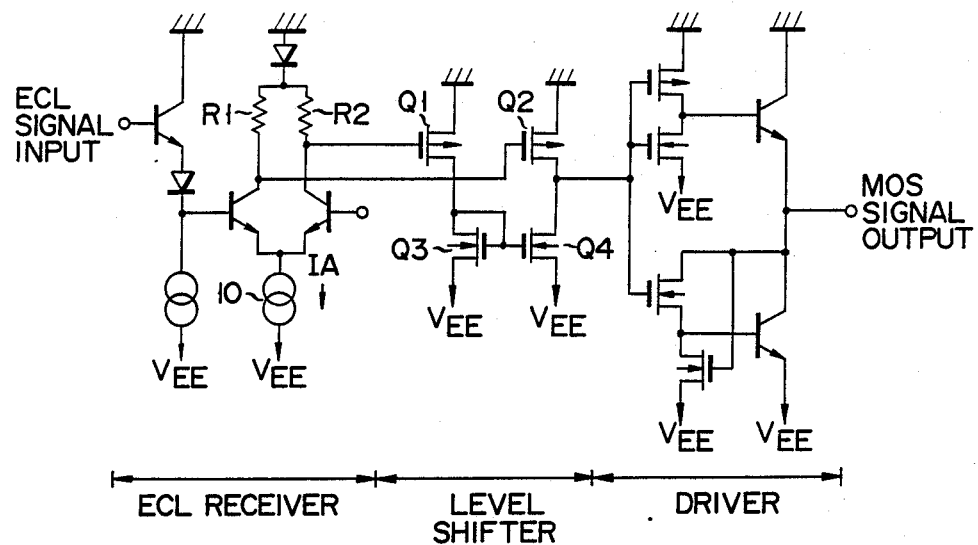
FIG. 1 is a circuit diagram showing a circuit for explaining a conventional ECL-CMOS level shift circuit.

FIG. 2 shows a circuit incorporating a level shift circuit according to an embodiment of the present invention. An FM signal or a TV signal is applied to preamplifier 11. The signal amplified by this preamplifier 11 is applied to LSI 12. LSI 12 is made up of prescaler 13 constructed with an ECL circuit, level shift circuit 14 for shifting an ECL level of the received signal into a CMOS logic level, and PLL circuit constructed with a CMOS circuit. The signal amplified by preamplifier 11 is supplied to ECL prescaler 13 in LSI 12. The output signal of this ECL prescaler 13 is supplied to level shift circuit 14. In this level shifter, a signal in an ECL level, e.g., with an amplitude of approximately 0.4 V, for example, into a signal in a CMOS logic level, e.g., with an amplitude of approximately 4.4 V. The output signal of level shift circuit 14 is supplied to programmable counter 16 formed in PLL circuit 15.

Figure 3:
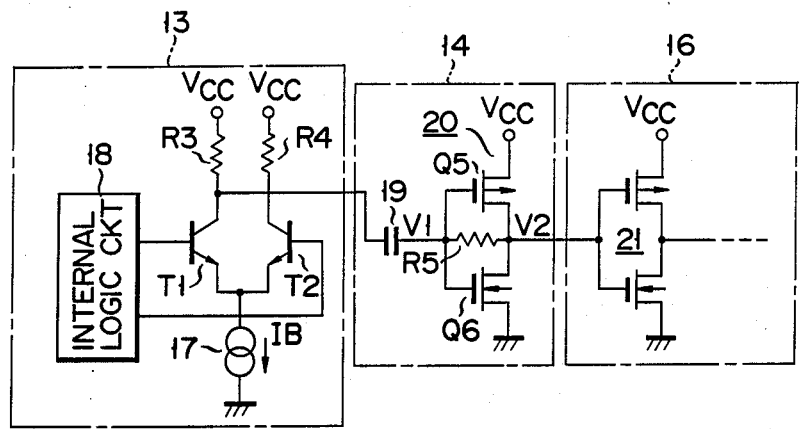
FIG. 3 is a circuit diagram showing a circuit for explaining a level shift circuit according to an embodiment of the present invention, the circuit made up of the output input stage of a programmable counter.

In FIG. 3 for explaining a configuration of a level shift circuit according to an embodiment of the present invention, there are illustrated in detail the output stage of ECL prescaler 13, level shift circuit 14, and the input stage of programmable counter 16, which make up the circuit shown in FIG. 2. The output stage of ECL prescaler 13 contains a differential amplifier made up of resistors R3 and R4, NPN bipolar transistors T1 and T2, and constant current source 17. First ends of resistors R3 and R4 are coupled with power source Vcc, while the second ends of these resistors are respectively coupled with the collectors of bipolar transistors T1 and T2. The emitters of bipolar transistors T1 and T2 are connected together, and constant current source 17 is connected between the interconnection point and a ground point. The bases of bipolar transistors T1 and T2 are coupled for reception with the output signal of internal logic circuit 18. Level shift circuit 14 is made up of capacitor (MOS capacitor) 19, CMOS inverter 20 made up of P and N channel MOS transistors Q5 and Q6, and a bias circuit for applying a bias voltage to the input node of CMOS inverter 20, and resistor R5 or a load element serving as a bias circuit for applying a bias voltage to the input node. A first electrode of capacitor 19 is connected to the collector of bipolar transistor T1. A second electrode of this capacitor 19 is connected to the input node of CMOS inverter 20. Resistor R5 is connected to between the input node and the output node of CMOS inverter 20. The output node of CMOS inverter 20 is connected the input stage of programmable counter (CMOS circuit) 16. In this instance, CMOS inverter 21 is used for that input stage.

The operation of the circuit shown in FIG. 3 will be described. The output signal of ECL prescaler 13, which derived from the collector of transistor T1, has an amplitude of approximately 0.4 V. When this signal is applied to the first electrode of capacitor 19, it is applied to the second electrode of the capacitor through its capacitive coupling path, and in turn to the input node of CMOS inverter 20. Bias resistor R5 is connected between the input node and the output node of CMOS inverter 20, and provides a predetermined bias voltage to the input node. The ECL level signal, which has been transferred through the capacitive coupling path, by CMOS inverter 20, the signal in an ECL level is converted into a signal in a CMOS logic level or of an amplitude of approximately of 4.4 V. The level shifted signal is then supply to the input node of CMOS inverter 21 contained in the input stage of programmable counter 16.

Figure 4:
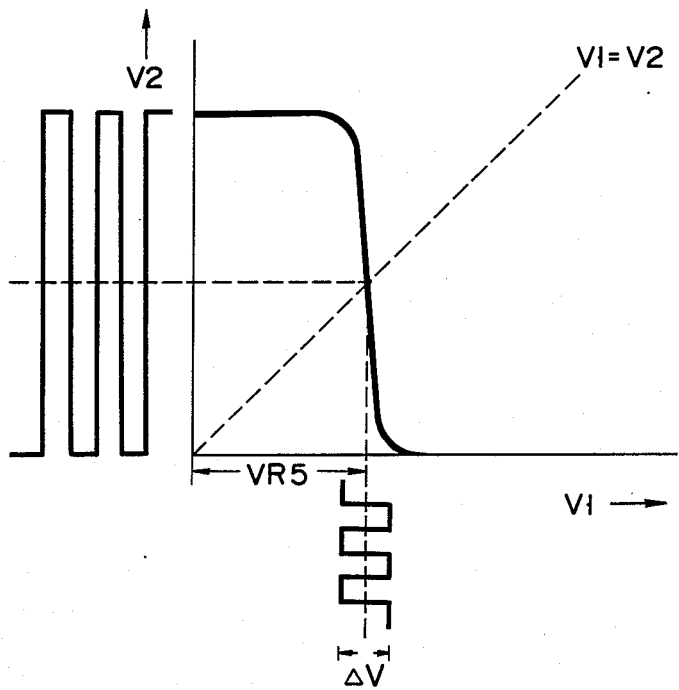
FIG. 4 shows a graph showing an input voltage output voltage characteristic, which is for explaining the input/output characteristic of the MOS inverter in the level shift circuit shown in FIG. 3.

FIG. 4 shows a relationship of input voltage V1 and output voltage V2 of the CMOS inverter 20 in the circuit shown in FIG. 3. Input voltage V1 is a potential formed by superposing the bias voltage generated across resistor R5 onto the output signal of ECL prescaler 13. In other words, the input voltage is a potential varying of an amplitude ΔV with respect to the bias voltage generated across resistor R5, in response to the output signal level of ECL prescaler 13. The amplitude ΔV of the output signal of ECL prescaler 13 is expressed by the product "IB×R" of resistance R of resistor R3 and current IB flowing through constant current source 17. The voltage as the sum of voltage ΔV and bias voltage VR is set at a value near the circuit threshold voltage of CMOS inverter 20. Therefore, if the threshold voltage of MOS transistors Q5 and Q6 varies within a tolerable range due to the parameter variance caused in the manufacturing stage or the power voltage varies with a tolerable range, CMOS inverter 20 stably operates. Thus, the CMOS inverter is stable against the parameter variances and the power voltage variation. The fact that the CMOS inverter is stable against such situations implies that the production yield of the device will be improved.

The ECL circuit and the CMOS inverter are coupled with each other so that the output signal of the ECL circuit is superposed on the bias voltage generated within the CMOS inverter. With the nature of a capacitor to prohibit a DC like voltage variation from passing therethrough, the capacitor shuts off the flow a DC-like voltage variation. Use of such a coupling capacitor ensures a stable operation of the CMOS inverter against the parameter variance and the power voltage variation, and consequently improves the production yield. Thus, according to the present invention, in designing the output stage of the ECL circuit, there is no need for allowing for the parameter variance caused in the device manufacturing stage and the power voltage variation. In this respect, the circuit design is simplified. It is noted here that the level shift circuit is made up of only capacitor 19, CMOS inverter 20 and the bias circuit or resistor R5. When comparing with the level shifter shown in FIG. 1, the level shifter in FIG. 3 requires a less number of circuit elements, and hence a less amount of current dissipation.

To apply the input bias voltage to CMOS inverter 20, the embodiment shown in FIG. 3 uses resistor R5 connected between the input node and the output node of this CMOS inverter 20. Alternatively, as shown in FIG. 5, a current path of N channel MOS transistor Q7 is connected between the input node and output node of CMOS inverter 20. Power voltage Vcc is applied to the gate of MOS transistor Q7, to set up a conduction state of the transistor. A modification as shown in FIG. 6 is also allowed. As is shown in FIG. 6, P channel MOS transistor Q8 is placed in the same place, with the gate being grounded for setting up a conduction state. In FIG. 7, the bias circuit is made up of N channel MOS transistor Q7 and P channel MOS transistor Q8. The current paths of these transistors are connected in parallel. To render these transistors conductive, the gates of transistors Q7 and Q8 are coupled with power source Vcc and a ground point, respectively.

Figure 8:
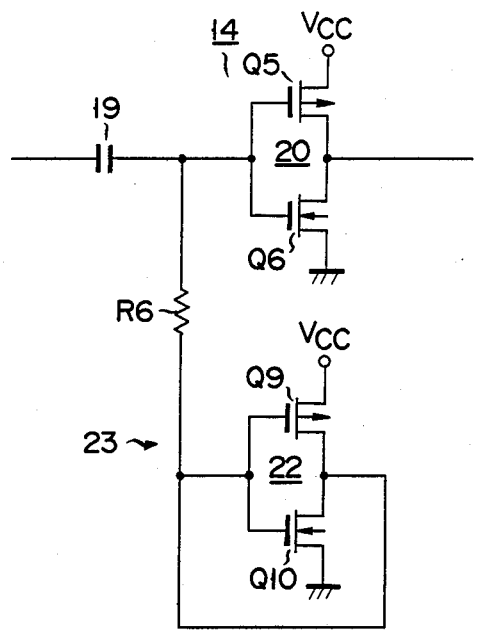

FIG. 8 shows another arrangement of the bias circuit for applying the bias voltage to the input node of CMOS inverter 20 in the circuit shown in FIG. 3. In this bias circuit, a first end of resistor R6 is connected to the input node of CMOS inverter 20. A second end of resistor R6 is connected to both the input and output nodes of CMOS inverter 22 containing P channel MOS transistor Q9 and N channel MOS transistor Q10. Bias circuit 23 is operable like the above bias circuits, and has the effects as those of the latter.

Figures 9, 10:
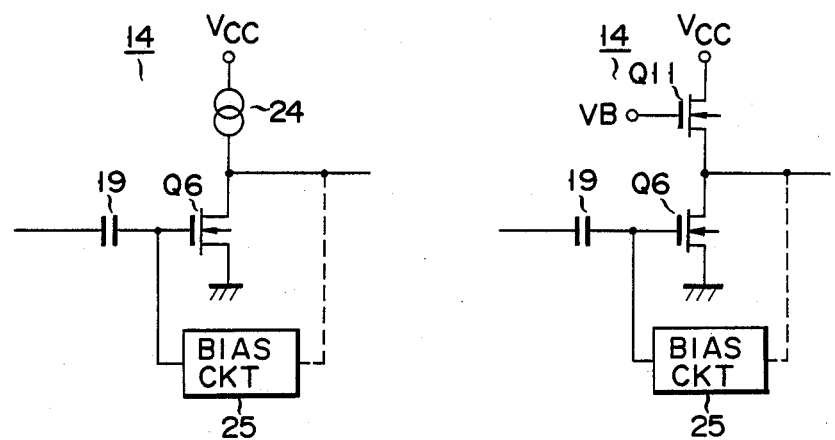

While the above-mentioned embodiment employs CMO inverter 20, other types of MOS inverter may of course be employed. Some specific examples of the MOS inverter are illustrated in FIGS. 9 through 13. In the example of FIG. 9, a MOS inverter is made up of current source 24 and N channel drive MOS transistor Q6. Bias circuit 25 is placed between the gate of MOS transistor Q and the output node. The bias circuit may be any of resistor R5 as shown in FIG. 3, MOS transistors Q7 and Q8 being set in a conductive state as shown in FIGS. 5 and 6, and a transfer gate as shown in FIG. 7. The bias circuit may be replaced by the bias circuit 23 consisting of resistor R6 and MOS inverter 22, as shown in FIG. 8.

The MOS inverter thus arranged is substantially the same as CMOS inverter 20 in the basic operation, and the attained effects.

Some specific examples of constant current source 24 are illustrated in FIGS. 10 to 13. The constant current source in FIG. 10 consists of N channel load MOS transistor Q11. The transistor is biased by voltage VB, to be in a conductive state. The example of FIG. 11 uses N channel load MOS transistor Q12 being conductive with its gate being biased by power voltage Vcc. The FIG. 12 example uses P channel load MOS transistor Q13 with the gate being connected to the output node for securing its conductive state. Resistor R7 may be used for the constant current source, as is shown in FIG. 13.

As seen from the foregoing description, the present invention has succeeded in providing a level shift circuit which is insensitive to the parameter variances caused in the manufacturing stage and the power voltage variation, and hence is stably operable, and has a good production yield. Additionally, a level shift circuit according to the present invention requires a simple circuit design for the output stage of the ECL circuit, and a less number of circuit elements, and a consequent reduction of current dissipation.

What is claimed is:

1. A level shift circuit for converting a signal in an ECL level into a signal in a CMOS logic level, comprising:
   capacitor means coupled at a first electrode with an output stage of an ECL circuit;
   a MOS inverter connected at an input node to a second electrode of said capacitor means and at an output node to an input stage of a CMOS circuit; and
   bias means for applying a bias voltage to the input node of said MOS inverter.

2. A level shift circuit according to claim 1, wherein said capacitor means includes a MOS capacitor.

3. A level shift circuit according to claim 1, wherein the bias voltage generated by said bias means is near a circuit threshold voltage of said MOS inverter.

4. A level shift circuit according to claim 1, wherein said bias means includes a resistive load connected between the input node and the output node of said MOS inverter.

5. A level shift circuit according to claim 4, wherein said resistive load includes a resistor.

6. A level shift circuit according to claim 4, wherein said resistive load includes a MOS transistor being placed in a conductive state with a gate being connected to one of power sources.

7. A level shift circuit according to claim 4, wherein said resistive load includes a first MOS transistor of a first conductivity type being in a conductive state with a gate coupled with one of power sources, and a second MOS transistor of a second conductivity type whose current path is connected in parallel with said first MOS transistor, said second MOS transistor being placed in a conductive state with connection of its gate to the other of the power sources.

8. A level shift circuit according to claim 1, wherein said bias means includes a resistor connected at a first end to the input node of said MOS inverter, and a MOS inverter whose input and output nodes are connected to a second end of said resistor.

9. A level shift circuit according to claim 1, wherein said MOS inverter includes a CMOS inverter.

10. A level shift circuit according to claim 1, wherein said MOS inverter includes a drive MOS transistor of the first conductivity whose gate is connected to the second electrode of said capacitor means and whose current path is connected at one end to one of power sources, and current supply means for supplying current to the other end of the current path of said drive MOS transistor.

11. A level shift circuit according to claim 10, wherein said current supply means includes a constant current source.

12. A level shift circuit according to claim 10, wherein said current supply means includes a load MOS transistor whose current path is connected between the other end of the current path of said drive MOS transistor and the other of the power sources, said load MOS transistor being placed in a conductive state with connection of its gate for reception with a bias voltage.

13. A level shift circuit according to claim 10, wherein said current supply means includes a load MOS transistor of the first conductivity whose current path is connected between the other end of the current path of said drive MOS transistor and the other of the power sources, said load MOS transistor being placed in a conductive state with connection of its gate with said other power source.

14. A level shift circuit according to claim 10, wherein said current supply means includes a load MOS transistor of the second conductivity whose current path is connected between the other end of the current path of said a drive MOS transistor and the other of the power sources, said load MOS transistor being placed in a conductive state with connection of its gate with the other end of said drive MOS transistor.

15. A level shift circuit according to claim 10, wherein said current supply means includes a resistor connected between the other end of the current path of said drive MOS transistor and the other of the power sources.

16. A level shift circuit according to claim 1, wherein said ECL circuit includes an output stage made up of a first resistor connected at a first end to one of the power sources, a first bipolar transistor connected at a collector to a second end of said first resistor, a second resistor connected at a first end to one of the power sources, a second bipolar transistor having a collector connected to a second end of said second resistor and an emitter connected to an emitter of said first bipolar transistor, a constant current source connected between the other of the power sources and the interconnection point of the emitters of said first and second bipolar transistors, and the first electrode of said capacitor means is connected to the collector of said first bipolar transistor.

17. A level shift circuit according to claim 1, wherein said CMOS circuit includes a CMOS inverter, and the input node of said CMOS inverter is connected to the output node of said MOS inverter.

* * * * *